United States Patent
Kurusu et al.

(10) Patent No.: US 9,691,646 B2
(45) Date of Patent: Jun. 27, 2017

(54) SUBSTRATE PROCESSING APPARATUS, SUBSTRATE DETECTION METHOD OF SUBSTRATE PROCESSING APPARATUS AND STORAGE MEDIUM

(71) Applicant: Tokyo Electron Limited, Tokyo (JP)

(72) Inventors: Kento Kurusu, Kumamoto (JP); Kohei Mori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 117 days.

(21) Appl. No.: 14/689,223

(22) Filed: Apr. 17, 2015

(65) Prior Publication Data

US 2015/0318194 A1    Nov. 5, 2015

(30) Foreign Application Priority Data

Apr. 30, 2014 (JP) ................. 2014-094112

(51) Int. Cl.
*H01L 21/67* (2006.01)
*H01L 21/02* (2006.01)
(52) U.S. Cl.
CPC .. *H01L 21/67259* (2013.01); *H01L 21/02041* (2013.01); *H01L 21/67023* (2013.01)
(58) Field of Classification Search
None
See application file for complete search history.

(56) References Cited

U.S. PATENT DOCUMENTS

| 2004/0040587 | A1* | 3/2004 | Lim ..................... B08B 3/00 134/113 |
| 2004/0189986 | A1* | 9/2004 | Chen ................ H01L 21/67259 356/218 |
| 2013/0010289 | A1* | 1/2013 | Nakamizo ......... H01L 21/67259 356/237.2 |

FOREIGN PATENT DOCUMENTS

| JP | H05326472 A | * 12/1993 | ............ B08B 3/02 |
| JP | 2920855 B |   4/1999 | |

\* cited by examiner

*Primary Examiner* — Michael Barr
*Assistant Examiner* — Cristi Tate-Sims
(74) *Attorney, Agent, or Firm* — Abelman, Frayne & Schwab

(57) ABSTRACT

A liquid processing apparatus includes a substrate holding and rotating unit provided with a rotating plate and a substrate support unit, and a liquid supply unit. The rotating plate is connected to a rotating shaft and a central portion of the rotating shaft is exposed to outside through an opening of the rotating plate. A ring-shaped retro-reflective sheet is attached to the central portion of the rotating shaft. The central opened part of the ring-shaped retro-reflective sheet is positioned on the extended line of the central axis of the wafer holding and rotating unit. Further, a supply pipe penetrates through the central opened part of the retro-reflective sheet. Laser light is irradiated to the retro-reflective sheet from the slanted upper side, the reflected light is received by the laser light projecting/receiving part, and presence or absence of the wafer is detected by a substrate detection unit.

11 Claims, 10 Drawing Sheets

SUBSTRATE PROCESSING APPARATUS, SUBSTRATE DETECTION METHOD OF SUBSTRATE PROCESSING APPARATUS AND STORAGE MEDIUM

CROSS-REFERENCE TO RELATED APPLICATIONS

This application is based on and claims priority from Japanese Patent Application No. 2014-094112, filed on Apr. 30, 2014, with the Japan Patent Office, the disclosure of which is incorporated herein in its entirety by reference.

TECHNICAL FIELD

The present disclosure relates to a substrate processing apparatus which processes a substrate, such as a semiconductor wafer or a glass substrate for a flat panel display.

BACKGROUND

A liquid processing is performed on a substrate using liquid in a process of manufacturing a semiconductor integrated circuit or a flat panel display. In order to perform the liquid processing, a single wafer processing device is utilized which includes a rotating plate, a substrate support unit provided on a peripheral edge of the rotating plate to support an outer periphery of a substrate, a liquid supply unit which supplies liquid to the substrate supported on a substrate support unit, and a cup unit which receives the liquid supplied to the substrate and scattered due to the rotation of the substrate.

Further, the liquid processing apparatus is provided with a detection apparatus which detects the presence or absence of the substrate supported on the substrate support unit. See, for example, Japanese Patent No. 2920855.

SUMMARY

A substrate processing apparatus according to one aspect of the present disclosure includes a rotatable rotating plate, a substrate holding and a rotating unit provided with a substrate support unit which supports the substrate above the rotating plate, and a substrate processing unit configured to process the substrate supported by the substrate support unit. In the substrate processing apparatus, a ring-shaped retro-reflective sheet is disposed below the substrate supported by the substrate support unit. A light projecting part configured to project incident light having a predetermined incident angle to the retro-reflective sheet from a slanted upper side, and a light receiving part configured to receive reflected light reflected in the same direction as the incident angle from the retro-reflective sheet are provided above the substrate supported by the substrate support unit. The presence or absence of the substrate is detected by the substrate detection unit based on intensity of the reflected light received by the light receiving part.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
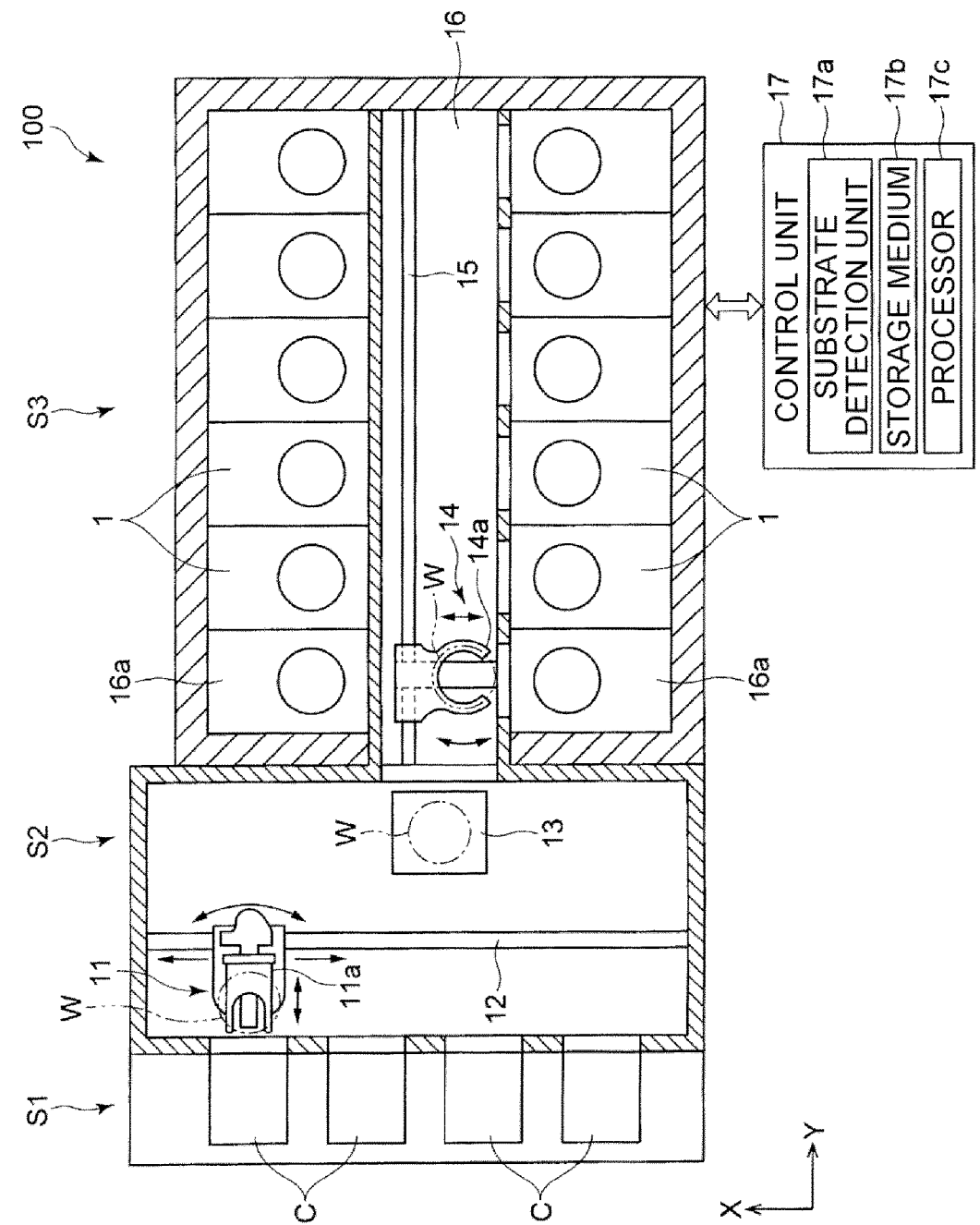
FIG. 1 is a schematic plan view illustrating a substrate processing apparatus into which a liquid processing apparatus according to a first embodiment of the present disclosure is inserted.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the related art, a detection apparatus provided in a liquid processing apparatus and configured to detect the presence or absence of a substrate is provided using a supply pipe installed by penetrating through a rotating plate on which a substrate is provided. That is, in the detection apparatus, light is projected from a light projecting part provided above the substrate disposed on the rotating plate, and the projected light is guided into a supply pipe and received by a light receiving part provided below the substrate and the supply pipe, thereby detecting the presence or absence of the substrate.

However, when liquid, such as for example, DIW is supplied to the substrate using the supply pipe installed by penetrating through the rotating plate, it is difficult to guide the light into the supply pipe and unable to detect the presence or absence of the substrate by guiding the light into the supply pipe.

The present disclosure has been made in an effort to solve the problems described above and intends to provide a substrate processing apparatus capable of surely detecting the presence or absence of a substrate supported by a substrate support unit, a substrate detection method of the substrate processing apparatus, and a storage medium.

A substrate processing apparatus according to one aspect of the present disclosure includes a substrate holding and rotating unit provided with a rotatable rotating plate and a substrate support unit which supports the substrate above the rotating plate, and a substrate processing unit configured to process the substrate supported by the substrate support unit. In the substrate processing apparatus, a ring-shaped retro-reflective sheet is disposed below the substrate supported by the substrate support unit. A light projecting part configured to project incident light having a predetermined incident angle to the retro-reflective sheet from a slanted upper side and a light receiving part configured to receive reflected light reflected in the same direction as the incident angle from the retro-reflective sheet are provided above the substrate supported by the substrate support unit. The presence or absence of the substrate is detected by the substrate detection unit based on the intensity of the reflected light received by the light receiving part.

In the substrate processing apparatus, a central opened part of the ring-shaped retro-reflective sheet is provided on an extended line of a central axis of rotation of the substrate holding and rotating unit.

In the substrate processing apparatus, a central part of the ring-shaped retro-reflective sheet is provided on the extended line of the central axis of rotation of the substrate holding and rotating unit.

In the substrate processing apparatus, the retro-reflective sheet is provided in the substrate holding and rotating unit, and rotates together with the substrate holding and rotating unit.

In the substrate processing apparatus, a supply pipe configured to supply liquid or gas by penetrating through the rotating plate is provided to penetrate through the central opened part of the retro-reflective sheet.

In the substrate processing apparatus, a supply pipe configured to supply liquid or gas by penetrating through the rotating plate is provided, and the retro-reflective sheet is provided on an upper end portion of the supply pipe together with the supply pipe in a stationary state.

In the substrate processing apparatus, an umbrella-shaped part is provided on the supply pipe and the retro-reflective sheet is attached to the umbrella-shaped part.

In the substrate processing apparatus, the substrate is formed with a semiconductor wafer and the substrate detection unit is configured to detect the presence or absence of the semiconductor wafer by comparing the intensity of reflected light from the light receiving part and a predetermined light intensity.

In the substrate processing apparatus, the substrate is formed with a glass substrate and the substrate detection unit is configured to detect the presence or absence of the glass substrate based on the intensity of the light reflected from the light receiving part and an attenuation factor of the glass substrate.

According to another aspect of the present disclosure, there is provided a substrate processing method of a substrate processing apparatus. The substrate processing apparatus includes a substrate holding and rotating unit provided with a rotatable rotating plate and a substrate support unit which supports the substrate above the rotating plate, and a substrate processing unit configured to process the substrate supported by the substrate support unit and in which a ring-shaped retro-reflective sheet is disposed below the substrate supported by the substrate support unit. A light projecting part configured to project incident light having a predetermined incident angle to the retro-reflective sheet from a slanted upper side, and a light receiving part configured to receive reflected light reflected in the same direction as the incident angle from the retro-reflective sheet are provided above the substrate supported by the substrate support unit. The substrate processing method includes projecting the incident light to the retro-reflective sheet from a slanted upper side by the light projecting part, receiving the reflected light from the retro-reflective sheet by the light receiving part, and detecting the presence or absence of the substrate by the substrate detection unit based on an intensity of the reflected light received by the light receiving part.

According to still another aspect of the present disclosure, there is provided a computer readable storage medium storing a computer program that, when executed, causes a computer to perform a substrate processing method of a substrate processing apparatus. The substrate processing apparatus includes a substrate holding and rotating unit provided with a rotatable rotating plate and a substrate support unit which supports the substrate above the rotating plate, and a substrate processing unit configured to process the substrate supported by the substrate support unit and in which a ring-shaped retro-reflective sheet is disposed in the central part below the substrate supported by the substrate support unit. A light projecting part configured to project incident light having a predetermined incident angle to the retro-reflective sheet from a slanted upper side, and a light receiving part configured to receive reflected light reflected in the same direction as the incident angle from the retro-reflective sheet are provided above the substrate supported by the substrate support unit. The substrate processing method includes projecting the incident light to the retro-reflective sheet from a slanted upper side by the light projecting part, receiving the light reflected from the retro-reflective sheet by the light receiving part, and detecting the presence or absence of the substrate by the substrate detection unit based on an intensity of the reflected light received by the light receiving part.

According to the present disclosure, it is possible to surely detect the presence or absence of the substrate supported on the substrate support unit.

First Embodiment

Hereinafter, a first embodiment of the present disclosure will be described with reference to FIG. 1 to FIG. 6. Same or corresponding reference numerals are given to same or corresponding members or components and redundant descriptions thereof will be omitted in the accompanied drawings. Further, the drawings are not intended to represent a relative ratio between the members or the components and thus, specific dimensions are required to be determined by an ordinary skill in the art in terms of the following embodiments to which the present disclosure is not limited.

First, descriptions will be made on a substrate processing apparatus including a liquid processing apparatus according to an exemplary embodiment of the present disclosure with reference to FIG. 1. FIG. 1 is a schematic plan view illustrating a substrate processing system according to the embodiment of the present disclosure. As illustrated, a substrate processing apparatus 100 includes a carrier station S1 in which a plurality of wafer carriers C (four wafer carriers in the illustrated example) are disposed accommodating a plurality of wafers (substrates) W such as a semiconductor wafer, a carrying-in/out station S2 which transfers the wafer W between the carrier station S1 and a liquid processing station S3 to be described later, and the liquid processing station S3 in which a liquid processing apparatus 1 to the embodiment of the present disclosure is disposed.

In the carrying-in/out station S2, a conveyance mechanism 11 is provided which carries out the wafer W from the wafer carrier C to dispose the wafer W on a stage 13 and further takes up the wafer W on the stage 13 to carry the wafer W into the wafer carrier C. The conveyance mechanism 11 includes a holding arm unit 11a which holds the wafer W. The conveyance mechanism 11 is movable along a guide 12 extending in an arrangement direction (X-direction in the drawing) of the wafer carrier C. Further, the conveyance mechanism 11 may move the holding arm unit 11a in a direction perpendicular to the X-direction (Y-direction in the drawing) and a vertical direction and rotate the holding arm unit 11a in a horizontal plane.

The liquid processing station S3 includes a conveyance chamber 16 extending in the Y-direction, a reversing mechanism 16a disposed at a carrying-in/out station S2 side within the conveyance chamber 16, and a plurality of liquid processing apparatuses 1 disposed at both sides of the conveyance chamber 16. Further, the conveyance chamber 16 is provided with a conveyance mechanism 14 which includes a holding arm unit 14a holding the wafer W. The conveyance mechanism 14 is movable along a guide 15 provided in the conveyance chamber 16 and extending in the Y-direction. Further, the conveyance mechanism 14 may move the holding arm unit 14a in the X-direction and rotate the holding arm unit 14a in the horizontal plane. The conveyance mechanism 14 conveys the wafer W between a transfer stage 13 of the carrying-in/out station S2, the reversing mechanism 16a, and each liquid processing apparatus 1. The reversing mechanism 16a turns the wafer W carried in by the conveyance mechanism 14 upside down. The wafer W is accommodated in the wafer carrier C of the carrier station S1 in such a manner that a circuit formed surface is directed upward (faces up), and conveyed from the conveyance mechanism 11 through the stage 13 by the conveyance mechanism 14 while the circuit formed surface is directed upward. Next, the wafer W is turned upside down by the reversing mechanism 16a and the circuit formed surface is directed downward (faces down). Thereafter, the wafer W is taken out from the reversing mechanism 16a by the conveyance mechanism 14 while the circuit formed surface is directed downward, and conveyed to the liquid processing apparatus 1 by the conveyance mechanism 14.

Further, the substrate processing apparatus 100 is provided with a control unit 17 which controls various components and members, and the substrate processing apparatus 100 and the liquid processing apparatus 1 are operated under the control of the control unit 17 and thus, for example, a liquid processing method, which will be described later, of the liquid processing apparatus is executed.

In the substrate processing apparatus 100 having the configuration described above, the wafer W is taken out from the wafer carrier C disposed in the carrier station S1 by the conveyance mechanism 11 and disposed on the stage 13 by the conveyance mechanism 11. The wafer W on the stage 13 is carried into the reversing mechanism 16a by the conveyance mechanism 14 within the liquid processing station S3, turned upside down in the reversing mechanism 16a and carried into the liquid processing apparatus 1 again by the conveyance mechanism 14. In the liquid processing apparatus 1, the top surface (an opposite surface to the circuit formed surface) of the wafer W is cleaned with a cleaning liquid, the cleaning liquid is washed out by, for example, deionized water, and the top surface of the wafer W is dried. After the top surface of the wafer W is dried, the wafer W is returned to the wafer carrier C in a path (sequence) which is reverse to the path (sequence) at the time of carrying-in of the wafer W. Further, other wafers W are sequentially conveyed to other liquid processing apparatuses 1 and cleaned during a single wafer W is being cleaned.

Next, the liquid processing apparatus 1 according to the embodiment of the present disclosure will be described with reference to FIG. 2 to FIG. 4. As illustrated, the liquid processing apparatus 1 is provided with a substantially rectangular case 21, a substantially cylindrical cup unit 22 provided in a substantially central portion within the case 21 and having an opened top surface, a wafer holding and rotating unit (substrate holding and rotating unit) 23 disposed at an inner side of the cup unit 22 and capable of holding and rotating the wafer W, and a brush (liquid supply unit) 24 supplying liquid to the wafer W held in the wafer holding and rotating unit 23 and cleaning the top surface of the wafer W by being contacted with the top surface the wafer W.

In the case 21, a conveyance port 21a through which the wafer W is carried in and carried out to and from the case 21 by the holding arm unit 14a (FIG. 1) of the conveyance mechanism 14 is formed. The conveyance port 21a is provided with a shutter (not illustrated) and the shutter is open at the time of carrying in or carrying out of the wafer W and the shutter is closed to close the conveyance port 21a during the processing of the wafer W.

The cup unit 22 is vertically movable between an upper position represented by a dotted line and a lower position represented by a solid line within the case 21 by an elevating mechanism (not illustrated). The cup unit 22 is positioned at the lower position at the time of carrying in or carrying out the wafer W and does not interfere with the carrying in or carrying out of the wafer W, and the cup unit 22 is positioned at the upper position during the processing of the wafer W and receives the liquid supplied to the wafer W to discharge the liquid from a drain (not illustrated).

Next, descriptions will be made on the wafer holding and rotating unit 23 with reference to FIG. 2 to FIG. 6.

Figure 2:
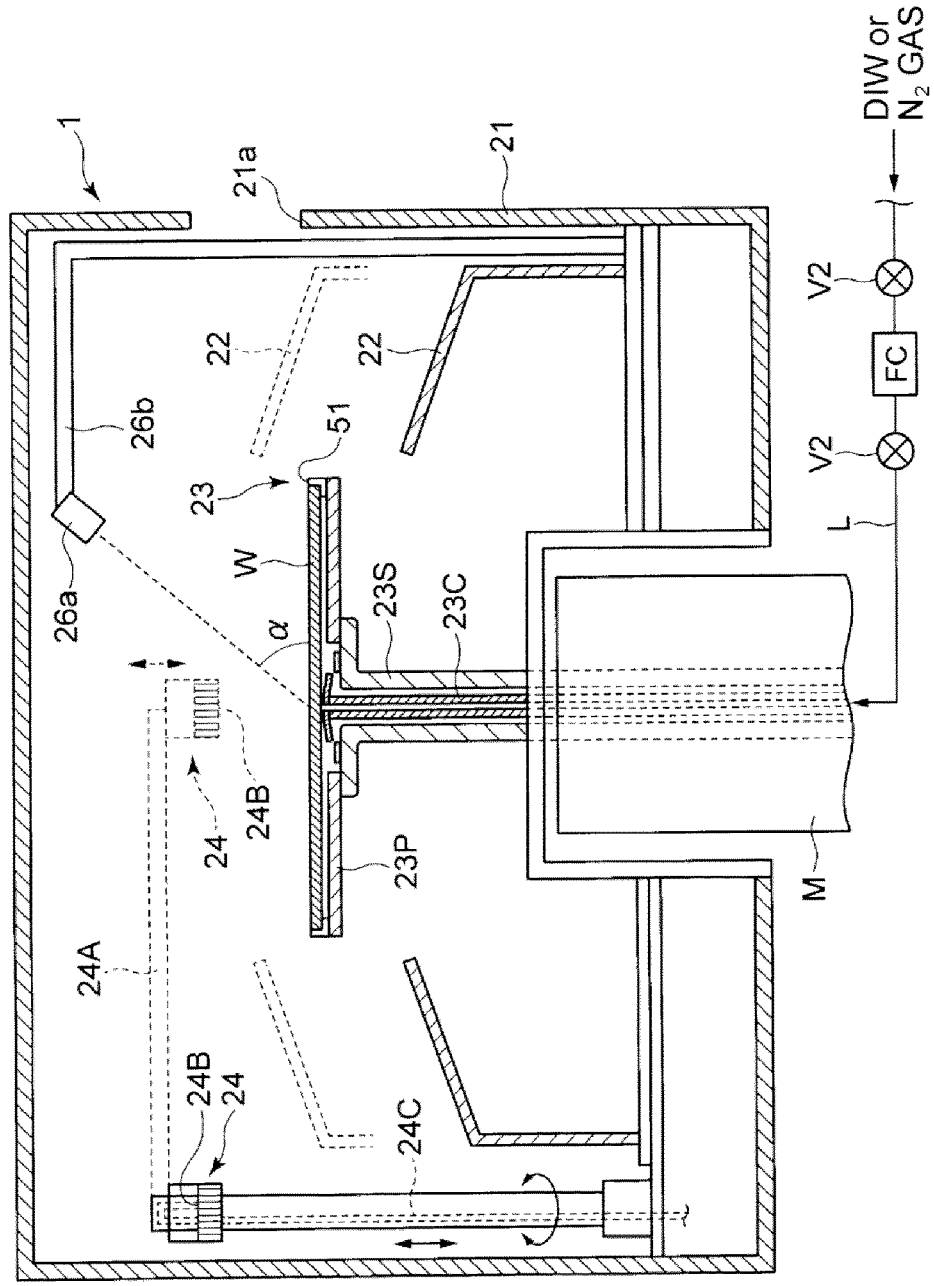
FIG. 2 is a schematic side view illustrating the liquid processing apparatus according to the first embodiment of the present disclosure.
Figure 5:
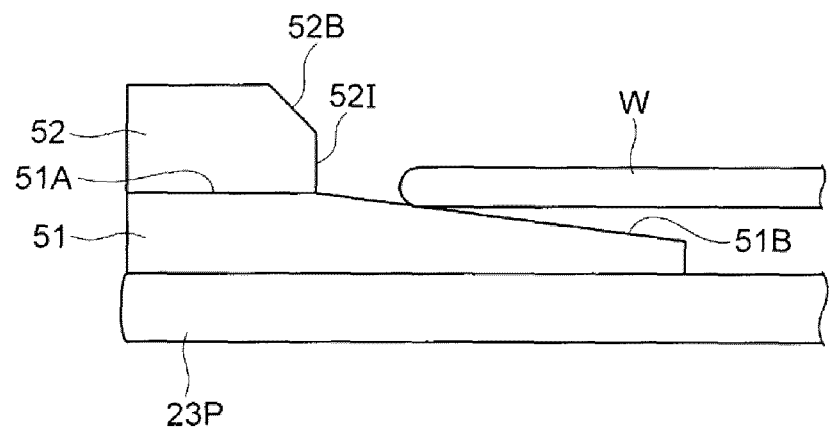
FIG. 5 is a cross-sectional view of a portion of the rotating plate of FIG. 4.

As illustrated in FIG. 2 and FIG. 5, the wafer holding and rotating unit 23 includes a rotating shaft 23S connected to a motor M disposed below the case 21 to be rotated and a rotating plate (rotating disc) 23P attached to the rotating shaft 23S in a substantially central portion of the lower surface thereof.

In the rotating shaft 23S, a through hole 27 penetrating through the central portion thereof is formed and a supply pipe 23C is provided within the through hole 27. The supply pipe 23C does not rotate and is fixed in the rotating shaft 23S and deionized water DIW may be supplied from the lower end of the supply pipe 23C. Otherwise, for example, nitrogen ($N_2$) gas from a nitrogen gas supply source may be supplied from the lower end of the supply pipe 23C. Since DIW or $N_2$ gas is flown out from a space between the rotating plate 23P and the wafer W DIW or $N_2$ gas is flowed out, it is possible to achieve an effect of reducing attachment of the liquid supplied to a top surface of the wafer W to a bottom surface thereof by being flown into the bottom surface.

The brush (liquid supply unit) 24 is supported by an arm 24A which is rotatable in the horizontal plane and vertically movable. A conduit 24C through which liquid supplied to the wafer W is formed in the arm 24A. The arm 24A rotates and moves down and liquid (e.g., deionized water (DIW)) flows into the conduit 24C from a predetermined liquid supply source at the same when (or slightly before) the brush 24 contacts the top surface of the wafer W, such that the liquid is supplied from an opening part 24B provided on a base of the brush 24 to the top surface of the wafer W. Accordingly, the brush 24 may contact the top surface of the wafer W to clean the top surface of the wafer W and wash out particles or residues removed by the brush 24.

Figure 3:
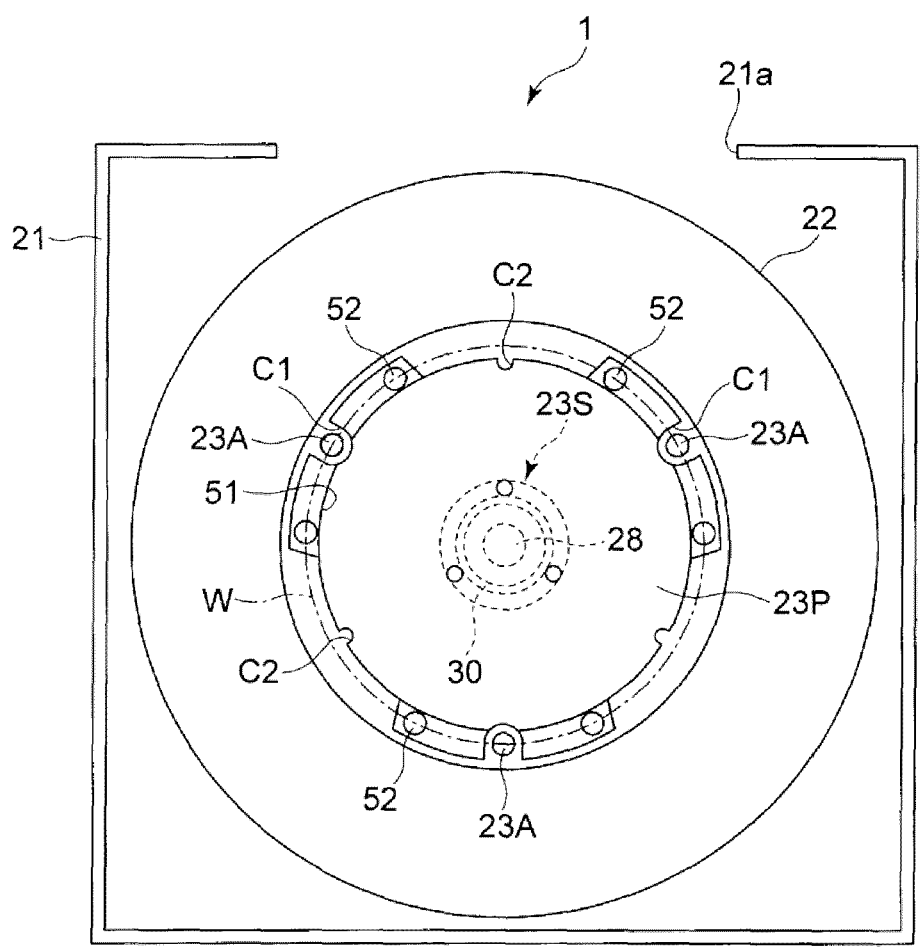
FIG. 3 is a schematic top plan view illustrating the liquid processing apparatus of FIG. 2.

Referring to FIG. 3, the rotating plate 23P has a disk shape having an outer diameter smaller than an inner diameter of the cup unit 22 and larger than an outer diameter of the wafer W. Further, as illustrated in FIG. 4, a wafer support unit (substrate support unit) 51 having a circular ring shape and supporting the wafer W is provided in the peripheral edge of the rotating plate 23P.

Further, as illustrated in FIG. 3, the wafer holding and rotating unit 23 includes three gripping units 23A attached to the lower peripheral edge of the rotating plate 23P and gripping the wafer W by pressing down the edge of the wafer W. These three gripping units 23A are disposed to be spaced apart from each other at angular intervals of, for example, 120 degrees, as illustrated in FIG. 3.

Figure 4:
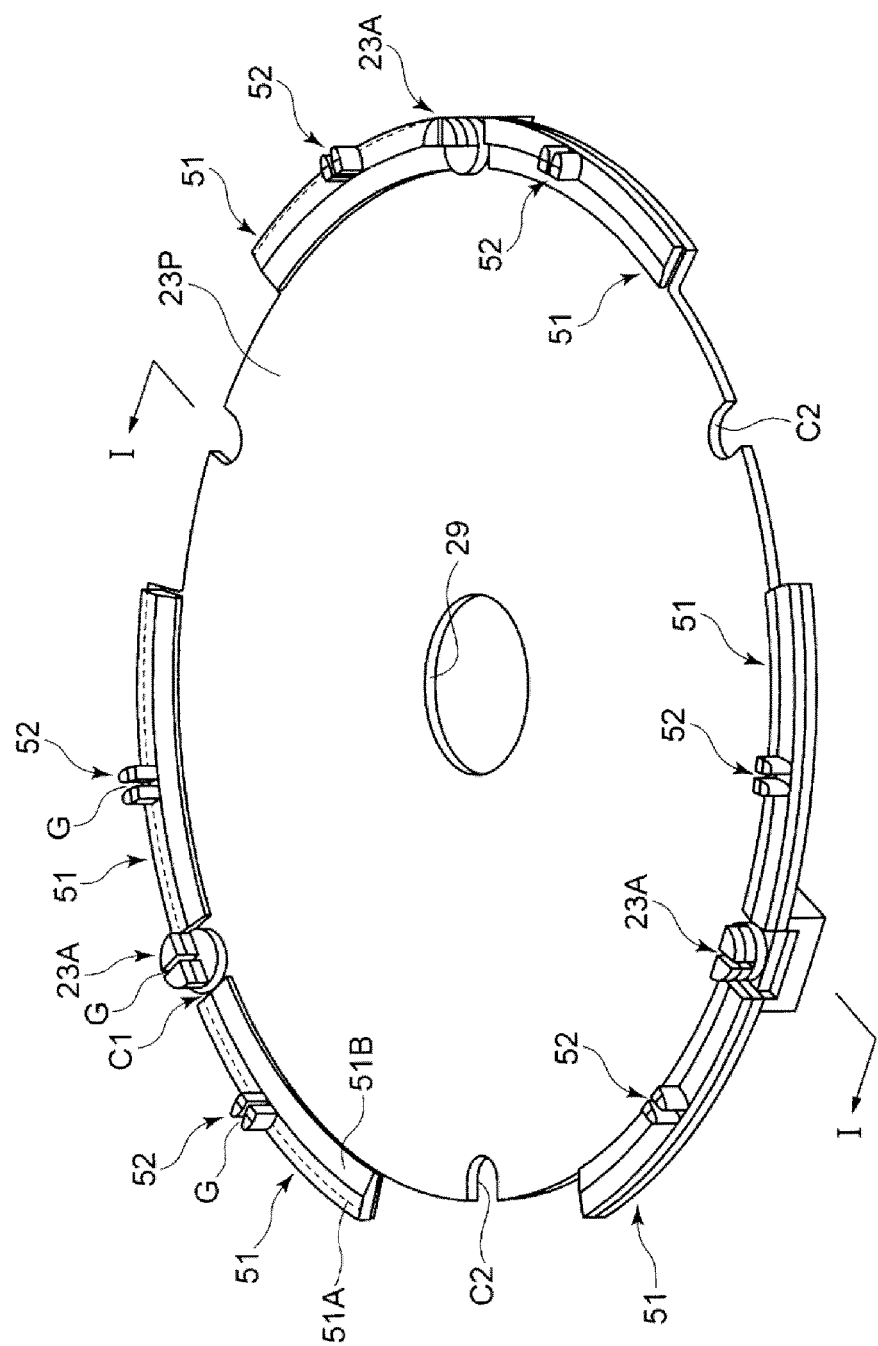
FIG. 4 is an explanatory view illustrating a rotating plate in a wafer support unit of the liquid processing apparatus of FIG. 2.

As illustrated in FIG. 3 and FIG. 4, the rotating plate 23P has a substantially circular top surface and the cutout parts C1 and C2 are formed on the circumference of the rotating plate 23P. The cutout parts C1 and C2 are alternately disposed to be spaced apart from each other at approximately 60 degrees. The cutout part C1 permits the gripping unit 23A attached to the lower part of the rotating plate 23P to protrude above the rotating plate 23P. Further, the cutout part C2 is provided to correspond to wafer retaining claws provided in the holding arm unit 14a (FIG. 1) of the conveyance mechanism 14 and permits the wafer retaining claws to vertically pass through the rotating plate 23P.

Further, as described above, a plurality of wafer support units (substrate support units) 51 which extend along the peripheral edge of the rotating plate 23P are provided in the top surface of the rotating plate 23P. The wafer support units 51 are formed to align with the cutout parts C1 and C2 of the rotating plate 23P. Further, each wafer support unit 51 includes a flat top surface part MA and a slanted face 51B slanted toward the center of the rotating plate 23P as illustrated in FIG. 5. The outer peripheral edge of the slanted face 51B (boundary between the flat top surface part MA and the slanted face 51B) is positioned along the circumference of a first circle having a diameter larger than the diameter of the wafer W and the inner peripheral edge of the slanted face 51B is positioned along a circumference of a second circle concentric with the first circle and having a diameter smaller than the diameter of the wafer W. Therefore, when the wafer W is disposed at the rotating plate 23P, the edge of the wafer W comes in contact with the slanted face 51B to support the wafer W (see FIG. 5). In this case, the wafer W is spaced apart from the top surface of the rotating plate 23P.

Further, a guide pin 52 is provided on the flat top surface part 51A of the wafer support unit 51. A side surface 52I of the guide pin 52 comes in contact with the outer peripheral edge of the slanted face 51B of the wafer support unit 51 on the lower end thereof. Further, a guide inclination face 52B slanted toward the center of the rotating plate 23P is formed on the guide pin 52. When the edge of the wafer W comes in contact with the guide inclination face 52B in a case where the wafer W is disposed on the wafer support unit 51 from the holding arm unit 14a (FIG. 1), the edge of the wafer W is guided to be slid down along the guide inclination face 52B and the wafer W is moved, such that the wafer W is positioned and supported on the wafer support unit 51.

Further, the guide pin 52 has a height at which the top surface of the guide pin 52 is located at a position higher than the top surface of the wafer W supported by the plurality of wafer support units 51.

Further, as illustrated in FIG. 4, grooves G extending in a direction intersecting with the peripheral edge of the rotating plate 23P are formed in substantially the central portions of the guide pin 52 and the gripping unit 23A provided on the wafer support unit 51.

Next, the rotating shaft 23S, the rotating plate 23P and the supply pipe 23C will be further described with reference to FIG. 4 and FIG. 6.

Figure 6:
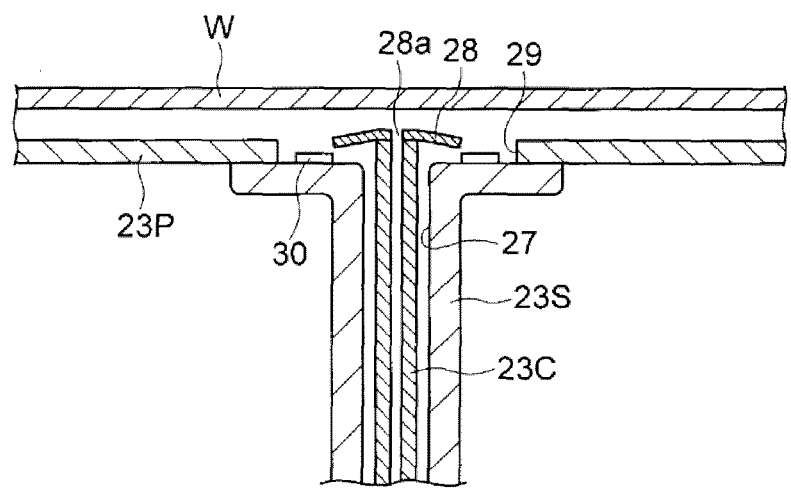
FIG. 6 is an enlarged view illustrating the rotating plate and a rotating shaft.

As illustrated in FIG. 6, the rotating plate 23P attached to the upper part of the rotating shaft 23S includes an opening 29.

Further, as described above, the through hole 27 which penetrates through the rotating shaft 23S is formed in the central portion of the rotating shaft 23S and the supply pipe 23C which supplies DIW or $N_2$ gas is provided in the through hole 27. The supply pipe 23C penetrates through the opening 29 of the rotating plate 23P to reach an upper side of the rotating plate 23P and an umbrella-shaped part 28 is attached to the upper end of the supply pipe 23C.

The supply pipe 23C is made of SUS (stainless) steel and the umbrella-shaped part 28 includes an opened hole 28a in the central part thereof and is made of acrylic which is a transparent material. As described above, the supply pipe 23C is fixed in the rotating shaft 23S without being rotated. The material of the umbrella-shaped part 28 is not limited to acrylic and may be made of other materials as long as a semi-transparent or transparent material capable of transmitting laser light to be described later.

Further, a ring-shaped retro-reflective sheet 30 is attached to the top surface of the central portion of the rotating shaft 23S exposed outward from the opening 29 of the rotating plate 23P. In this case, the central opened part of the ring-shaped retro-reflective sheet 30 is positioned on the extended line of the central axis of rotation of the wafer holding and rotating unit 23. Further, the supply pipe 23C penetrates through the central opened part of the retro-reflective sheet 30. The retro-reflective sheet 30 is a reflection sheet which reflects the light incident from a predetermined direction to the direction identical to the incidence direction. The retro-reflective sheet 30 described above has a configuration provided with glass beads refracting light or a prism refracting light. In the present embodiment, the ring-shaped retro-reflective sheet 30 is attached to the top surface of the central portion of the rotating shaft 23S, but the present disclosure is not limited thereto. The ring-shaped retro-reflective sheet 30 may be attached to the rotating plate 23P.

Further, as illustrated in FIG. 2, a post 26b is provided at outer side of the rotating plate 23P and a laser light projecting/receiving part 26a is supported on the post 26b.

The laser light projecting/receiving part 26a supported on the post 26b projects laser light having an incident angle α of, for example, 50 degrees to the retro-reflective sheet 30 attached to the top surface of the rotating shaft 23S from the slanted upper side and receives the reflected light reflected from the retro-reflective sheet 30 in the same direction as the incident direction.

Also, the intensity of the reflected light received by the laser light projecting/receiving part 26a is sent to the control unit 17.

As illustrated in FIG. 1, the control unit 17 includes a substrate detection unit 17a which detects the presence or absence of the wafer W based on the intensity of the reflected light received by the laser light projecting/receiving part 26a.

When the semiconductor wafer W is supported by the wafer support unit 51 on the rotating plate 23P, the substrate detection unit 17a compares the intensity of the reflected light received by the laser light projecting/receiving part 26a with a predetermined light intensity to detect the presence or absence of the semiconductor wafer W.

In the meantime, as illustrated in FIG. 1, the control unit 17 may be implemented by, for example, a general computer as hardware and a program (e.g., apparatus control program and processing recipe) for operating the computer. The software may be stored in a storage medium such as a hard disk drive fixedly provided in the computer or a storage medium such as a CD-ROM, a DVD, or a flash memory, which is detachably set in a computer. The storage medium is denoted by a reference numeral 17b. The processor 17c reads and executes a predetermined processing recipe from the storage medium 17b based on, for example, instruction from a user interface (not illustrated) as needed and accordingly, respective functional components of the substrate processing apparatus are operated under the control of the control unit 17, thereby performing a predetermined processing. A program for executing a procedure of the liquid processing method is stored in the storage medium 17b.

Next, descriptions will be made on operations of the present embodiment configured with matters described above.

Here, descriptions will be made on operations (liquid processing method) of the liquid processing apparatus 1 according to the embodiment of the present disclosure. As described above, the wafer W is turned upside down by the reversing mechanism 16a of the liquid processing station S3 and carried into the liquid processing apparatus 1 in a state where the circuit formed surface of the wafer W is directed downward. In the following description, the top surface of the wafer W indicates a surface opposite to the circuit formed surface of the wafer W.

First, the cup unit 22 is lowered and positioned at a lower position indicated by a solid line in FIG. 2 and further, the gripping unit 23A is opened outward to secure a space where the wafer W is disposed. Also, an operation of the laser light projecting/receiving part 26a is started. That is, laser light from the laser light projecting/receiving part 26a is projected toward the retro-reflective sheet 30 attached to the rotating shaft 23S from the slanted upper side. In this case, laser light is irradiated onto the retro-reflective sheet 30 at an incident angle α of 50 degrees.

Subsequently, the conveyance port 21a of the case 21 is opened and the wafer W is carried into the case 21 from the conveyance port 21a by the wafer conveyance arm unit 14a of the conveyance mechanism 14 and stopped above the wafer holding and rotating unit 23. Subsequently, the wafer conveyance arm unit 14a is lowered and the wafer W is transferred from the wafer conveyance arm unit 14a to the wafer holding and rotating unit 23. In this case, the wafer W is guided by the guide pin 52 and supported above the rotating plate 23P by the wafer support unit 51 provided on the top surface of the peripheral edge of the rotating plate 23P.

After the wafer conveyance arm unit 14a is retreated from the conveyance port 21a to outside, the gripping unit 23A presses down the edge of the wafer W. In this case, the wafer W is gripped by the gripping unit 23A while being supported by the wafer support unit 51. When the cup unit 22 is positioned at the upper position thereof illustrated in FIG. 2, the rotation of the rotating shaft 23S and the rotating plate 23P is started by the motor M. Accordingly, the wafer W supported on the wafer support unit 51 and gripped by the gripping unit 23A also rotates. A rotation speed of the wafer W ranges, for example, from 500 rotations per minute (rpm) to 2000 rpm. In this case, for example, DIW is supplied from the supply pipe 23C provided within the rotating shaft 23S to the space between the wafer W and the rotating plate 23P.

The operation of the laser light projecting/receiving part 26a is continued while the rotating shaft 23S and the rotating plate 23P are rotated. In this case, the central part of the ring-shaped retro-reflective sheet 30 may be provided on the extended line of the central axis of rotation of the wafer holding and rotating unit 23 from the view point that a detection precision is improved by making it possible to detect the same detection portion.

When the wafer W is supported on the wafer support unit 51, laser light from the laser light projecting/receiving part 26a is blocked by the wafer W and does not arrive at the retro-reflective sheet 30. Therefore, the reflected light of the laser light is not received by the laser light projecting/receiving part 26a.

In the meantime, when the wafer W is not supported on the wafer support unit 51, the laser light from the laser light projecting/receiving part 26a arrives at the retro-reflective sheet 30 and is reflected in the same direction as the incident direction having an incident angle of 50 degrees. The reflected laser light is received by the laser light projecting/receiving part 26a.

When the reflected laser light is received by the laser light projecting/receiving part 26a, the substrate detection unit 17a provided in the control unit 17 compares the intensity of the reflected laser light with a predetermined intensity to detect the presence or absence of the wafer W based on the signal from the laser light projecting/receiving part 26a.

In this manner, the presence or absence of the wafer W to be supported on the wafer support unit 51 may be surely detected.

When the substrate detection unit 17a detects the wafer W supported by the wafer support unit 51, the liquid processing method is continuously executed and in the meantime, when the substrate detection unit 17a does not detect the wafer W in the wafer support unit 51, the liquid processing method is stopped at that time.

That is, when the substrate detection unit 17a detects the wafer W, the arm 24A of the brush 24 rotates, and the brush 24 moves to a position indicated by the dotted line in FIG. 2 and descends toward the top surface of the wafer W. For example, DIW is supplied from the opening part 24B of the brush 24 to the top surface of the wafer W at the same time (or slightly before) when the tip of the brush 24 comes in contact with the top surface of the wafer W. The DIW flows toward the edge of the wafer W to be gradually expanded on the top surface of the wafer W and flows out from the edge of the wafer W to outside by the rotation of the wafer W.

Thereafter, the brush 24 is moved toward the edge of the wafer W by the rotation of the arm 24A. Due to the rotation of the wafer W and the movement of the brush 24, the brush 24 comes in contact with the entire surface of the wafer W and particles or impurities removed by the brush 24 are washed out by the DIW.

Here, even during the cleaning by the brush 24, the operation of the laser light projecting/receiving part 26a is continued and the detection of the presence or absence of the wafer W by the substrate detection unit 17a is also continued. Accordingly, when the wafer W is not detected during the cleaning processing, the cleaning by the brush 24 is controlled to be stopped.

After the brush 24 is moved outside of the edge of the wafer W, supplying of DIW is stopped and the top surface of the wafer W is dried. Thereafter, the wafer W is carried out to the outside of the case 21 in a sequence which is reverse to the sequence at the time of carrying-in of the wafer W.

Further, in the embodiment, even though an example where the supply pipe 23C is provided within the through hole 27 formed in the rotating shaft 23S and DIW is supplied into the supply pipe 23C is described, the present disclosure is not limited thereto and $N_2$ gas may be supplied to the supply pipe 23C.

As described above, according to the liquid processing apparatus 1 of the embodiment of the present disclosure, laser light is projected from the laser light projecting/receiving part 26a toward the retro-reflective sheet 30 from the slanted upper side, and the reflected light from the retro-reflective sheet 30 is received by the laser light projecting/receiving part 26a such that the presence or absence of the wafer W to be supported on the wafer support unit 51 may be surely and readily detected. As described above, since it is unnecessary to introduce light into the supply pipe 23C provided within the rotating shaft 23S to detect the presence or absence of the wafer W, the supply pipe 23C provided within the rotating shaft 23S may be utilized as a supply pipe for supplying liquid, for example, DIW. Further, the presence or absence of the wafer W may be detected even during the DIW is being supplied.

Second Embodiment

Next, descriptions will be made on a second embodiment of the present disclosure with reference to FIG. 7 and FIG. 8.

Figure 7:
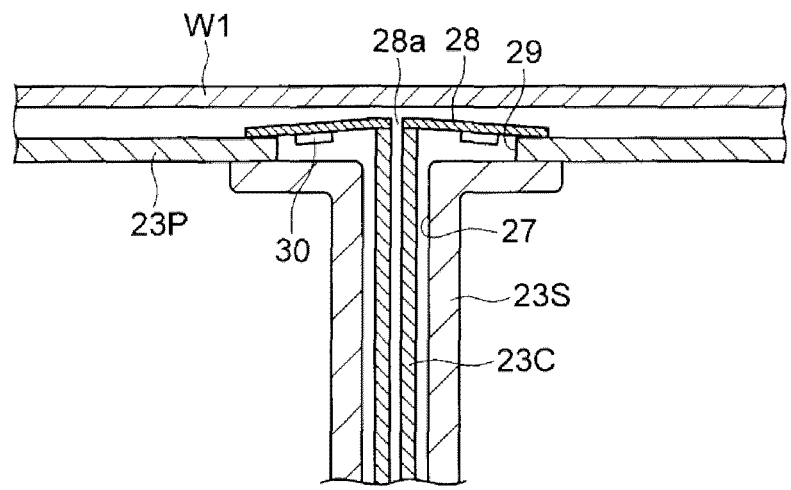
FIG. 7 is an enlarged view illustrating a rotating plate and a rotating shaft of a liquid processing apparatus according to a second embodiment of the present disclosure.
Figure 8:
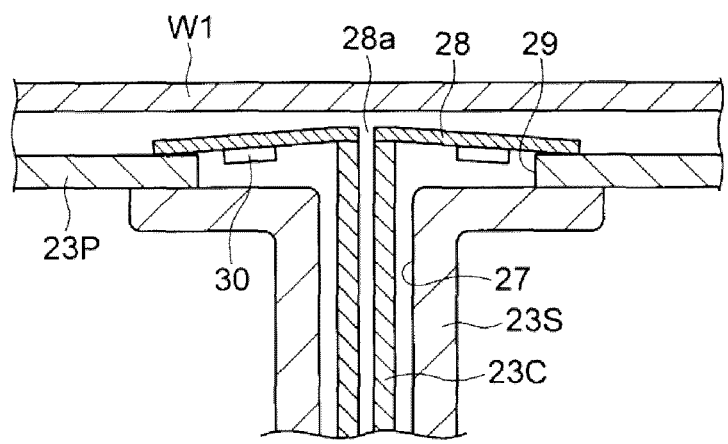
FIG. 8 is a diagram illustrating a retro-reflective sheet provided on an umbrella-shaped part.

In a second embodiment illustrated in FIG. 7 and FIG. 8, the ring-shaped retro-reflective sheet 30 is provided on the umbrella-shaped part 28 attached to the upper end of the supply pipe 23C instead of providing the ring-shaped retro-reflective sheet 30 on the central portion of the rotating shaft 23S.

In the second embodiment illustrated in FIG. 7 and FIG. 8, same reference numerals are given to the same members as those of the first embodiment illustrated in FIG. 1 to FIG. 6 and detailed descriptions thereof will be omitted.

As illustrated in FIG. 7 and FIG. 8, the supply pipe 23C is disposed in a stopped state without being rotated within the through hole 27 of the of rotatable rotating shaft 23S and the umbrella-shaped part 28 having an opened hole 28a is attached to the upper end of the supply pipe 23C.

The supply pipe 23C is made of stainless steel and the umbrella-shaped part 28 is made of acrylic. Also, the ring-shaped retro-reflective sheet 30 is attached on the lower surface of the umbrella-shaped part 28 made of acrylic.

Further, a plurality of substrate support units 51 and gripping units 23A are attached to the peripheral edge of the rotating plate 23P.

In FIG. 7 and FIG. 8, first, a transparent glass substrate W1 as a substrate is supported on the substrate support unit 51.

Next, the gripping units 23A press down the edge of the glass substrate W1. As described above, the glass substrate W1 is gripped by the gripping units 23A in a state of being supported by the substrate support unit 51. When the cup unit 22 is positioned at the upper position thereof illustrated in FIG. 2, the rotation of the rotating shaft 23S and the rotating plate 23P is started by the motor M. Accordingly, the glass substrate W1 supported on the substrate support unit 51 and gripped by the gripping units 23A is also rotated. The rotation speed of the glass substrate W1 may be in a range, for example, from 500 rotations per minute (rpm) to 2000 rpm. In this case, for example, DIW is supplied from the supply pipe 23C provided within the rotating shaft 23S to a space between the glass substrate W1 and the rotating plate 23P as a back rinse fluid.

During the supply of DIW, laser light is projected from the laser light projecting/receiving part 26a toward the retro-reflective sheet 30 attached to the lower surface of the umbrella-shaped part 28 from the slanted upper side. In this case, laser light transmits the umbrella-shaped part 28 made of acrylic and is irradiated onto the retro-reflective sheet 30 at an incident angle α of 50 degrees.

When the glass substrate W1 is supported on the substrate support unit 51, laser light from the laser light projecting/receiving part 26a transmits the glass substrate W1 and arrives at the retro-reflective sheet 30. Next, the reflected light of laser light from the retro-reflective sheet 30 is reflected in the same direction as the incident direction having the incident angle α and received by the laser light projecting/receiving part 26a.

In the meantime, when the glass substrate W1 is not supported on the substrate support unit 51, the laser light from the laser light projecting/receiving part 26a transmits the umbrella-shaped part 28, arrives at the retro-reflective sheet 30 and is reflected in the same direction as the incident direction having the incident angle α of 50°. The reflected light of laser light is received by the laser light projecting/receiving part 26a.

When the reflected light of the laser light is received by the laser light projecting/receiving part 26a, the substrate detection unit 17a provided in the control unit 17 obtains an attenuation factor of the reflected light from the intensity of the reflected light based on the signal from the laser light projecting/receiving part 26a. Next, the substrate detection unit 17a compares the attenuation factor of the reflected light with a predetermined attenuation factor and detects the presence or absence of the wafer W.

In this case, when the glass substrate W1 is present, the attenuation factor of the reflected light becomes larger, and when the glass substrate W1 is not present, the attenuation factor of the reflected light becomes smaller. In this manner, it is possible to surely detect the presence or absence of the wafer W to be supported by the substrate support unit 51. Further, the presence or absence of the glass substrate W1 may be detected in such a way that a value obtained by multiplying the intensity of the incident light of the laser light projecting/receiving part 26a by the predetermined attenuation factor is stored and the intensity of the reflected light is compared with the stored value obtained by the multiplication to determine which one of the intensity of the reflected light and the stored value is larger than the other.

When the substrate detection unit 17a detects that the glass substrate W1 is accurately supported by the substrate support unit 51, the liquid processing method is continuously executed. In the meantime, when the substrate detection unit 17a detects that the glass substrate W1 is not accurately supported by the substrate support unit 51, the liquid processing method is stopped at that time.

That is, when the substrate detection unit 17a detects the glass substrate W1, the arm 24A of the brush 24 is rotated, and the brush 24 is moved to a position indicated by the dotted line in FIG. 2 and is lowered toward the top surface of the glass substrate W1. For example, DIW is supplied from the opening part 24B of the brush 24 to the top surface of the wafer W at the same time (or slightly before) when the tip of the brush 24 comes in contact with the top surface of the wafer W. The supplied DIW flows on the top surface of the glass substrate W1 to be gradually expanded toward the edge of the glass substrate W1 and flows out from the edge of the glass substrate W1 to outside by the rotation of the glass substrate W1.

As described above, according to the present embodiment, laser light is projected from the laser light projecting/receiving part 26a toward the retro-reflective sheet 30 from the slanted upper side and the reflected light from the retro-reflective sheet 30 is received by the laser light projecting/receiving part 26a such that it is possible to surely and readily detect whether the glass substrate W1 is supported on the wafer support unit 51, that is, to surely and readily detect the presence or absence of the glass substrate W1. As described above, since it is unnecessary to introduce light into the supply pipe 23C provided within the rotating shaft 23S to detect the presence or absence of the glass substrate W1, the supply pipe 23C provided within the rotating shaft 23S may be utilized as a supply pipe for supplying liquid, such as for example, DIW. Further, since the retro-reflective sheet 30 is provided on the lower surface of the umbrella-shaped part 28 on the upper end of the supply pipe 23C provided in a state of being stopped, the retro-reflective sheet 30 is also in the stopped state. Therefore, the intensity of the reflected light from the retro-reflective sheet 30 may be stabilized.

In general, when laser light transmits the glass substrate W1 which is transparent, the attenuation factor of the reflected light is small. In this case, the retro-reflective sheet 30 is made stopped and the intensity of the reflected light is made stable such that the attenuation factor of the reflected light may be detected even when the attenuation factor is small, thereby surely detecting the presence or absence of the glass substrate W1.

Test Example

Next, descriptions will be made on a test example of the second embodiment with reference to FIG. 9.

Figure 9:
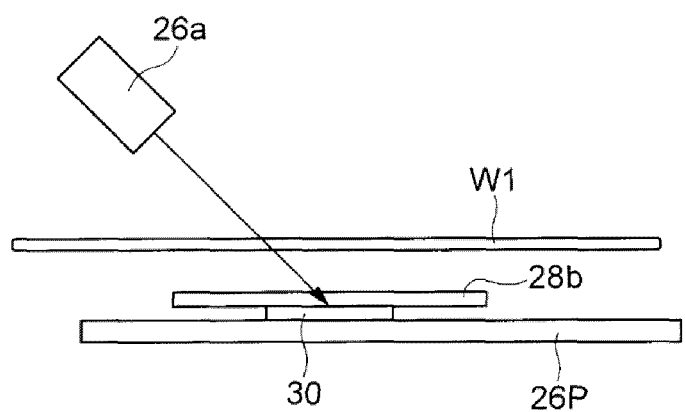
FIG. 9 is a diagram illustrating a test result in the second embodiment of the present disclosure.

As illustrated in FIG. 9, the retro-reflective sheet 30 was attached on the rotating plate 23P and an acrylic plate 28b made of the same material as that of the umbrella-shaped part 28 was provided on the retro-reflective sheet 30.

Further, the laser light projecting/receiving part 26a was provided above the acrylic plate 28b.

Next, in three cases of (1) where the glass substrate W1 was not yet disposed above the acrylic plate 28b, (2) where the glass substrate W1 was disposed above the acrylic plate 28b, and (3) where the glass substrate W1 was removed from above the acrylic plate 28b, the laser light was projected from the laser light projecting/receiving part 26a to the retro-reflective sheet 30 from the slanted upper side and the reflected light from the retro-reflective sheet 30 was received by the laser light projecting/receiving part 26a.

In these cases, distances between the laser light projecting/receiving part 26a and an irradiated position on the retro-reflective sheet 30 were 300 mm to 350 mm.

Further, the inclination angles of laser light to the retro-reflective sheet 30 were 40 degrees to 55 degrees.

Further, a glass substrate $W_1$ having a thickness of 0.5 mm, a glass substrate $W_2$ having a thickness of 0.7 mm, and a glass substrate $W_3$ having a thickness of 1 mm were used as the glass substrate W1.

Intensities (light quantities) of the reflected light received in the laser light projecting/receiving part 26a are indicated in Table 1.

[Test Result]

TABLE 1

| Substrate Type | Light Quantity | | | Difference in light quantity (※) | Attenuation factor (※) |
|---|---|---|---|---|---|
| | Before disposition | During disposition | After taken out | | |
| 0.5 mm substrate | 4022 | 3400 | 4020 | 622 | 15.46 |
| 0.7 mm substrate | 3994 | 3331 | 3979 | 663 | 16.60 |
| 1 mm substrate | 3979 | 3173 | 4022 | 806 | 20.26 |

Difference in light quantity: (Before deposition − During disposition)
Attenuation factor: (Difference in light quantity)/(Light quantity before disposition)

<Summary>

As illustrated in Table 1, attenuation factors ranging from 15% to 20% were obtained for substrates $W_1$, $W_2$, and $W_3$. These values are enough for setting a threshold value (10% or more) and the detection of the presence or absence of the glass substrate W1 became possible even when any type of substrate is used. For example, the attenuation factor of 15% may be set as a predetermined attenuation factor used for judgment in a case where the liquid processing apparatus performs the detection of the presence or absence of the 1.0 mm wafer W.

Modified Example

In a second embodiment, even though a configuration in which the ring-shaped retro-reflective sheet 30 is provided on the umbrella-shaped part 28 is employed as illustrated in FIG. 7 and FIG. 8, the same glass substrate detection as that in the second embodiment may be executed in the apparatus having the configurational arrangement of the umbrella-shaped part 28 and the ring-shaped retro-reflective sheet 30 illustrated in FIG. 6 of the first embodiment. Further, in the apparatus having the configurational arrangement of the umbrella-shaped part 28 and the ring-shaped retro-reflective sheet 30 illustrated in FIG. 7 and FIG. 8, the same glass substrate detection as that in the first embodiment may be executed.

Third Embodiment

Next, descriptions will be made on a third embodiment of the present disclosure with reference to FIG. 10A to FIG. 13.

The configuration of the wafer holding and rotating unit 23 in the third embodiment illustrated in FIG. 10A to FIG. 13 is different from that in the first embodiment. Further, the cup unit 22 does not move vertically and is fixed to the upper position indicated by the dotted line of FIG. 2. Other configurations for other components are substantially the same as those of the first embodiment illustrated in FIG. 1 to FIG. 6.

In the third embodiment illustrated in FIG. 10A to FIG. 17, same reference numerals are given to the same members as those of the first embodiment illustrated in FIG. 1 to FIG. 6 and detailed descriptions thereof will be omitted.

Figure 11:
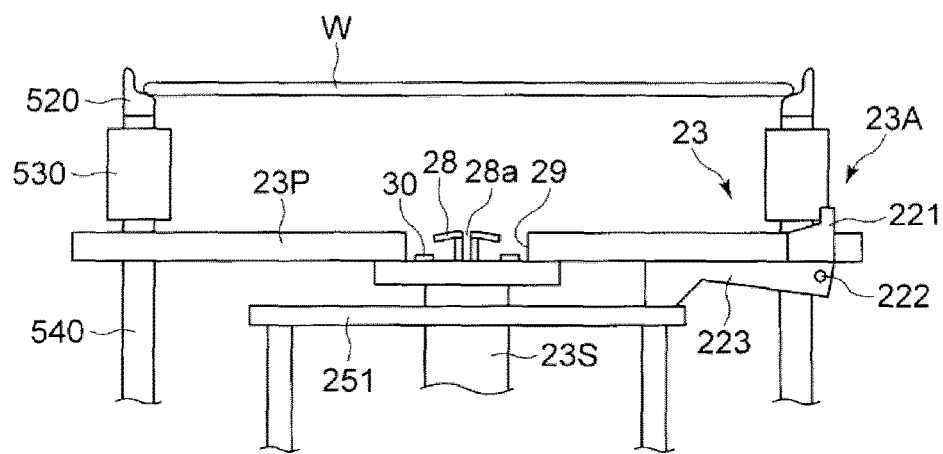
FIG. 11 is a diagram illustrating an operation of an elevatable support member according to the third embodiment.

As illustrated in FIG. 11, the ring-shaped retro-reflective sheet 30 is attached to the top surface of the central portion of the rotating shaft 23S exposed from the opening of the rotating plate 23P toward the outside.

Figure 10A:
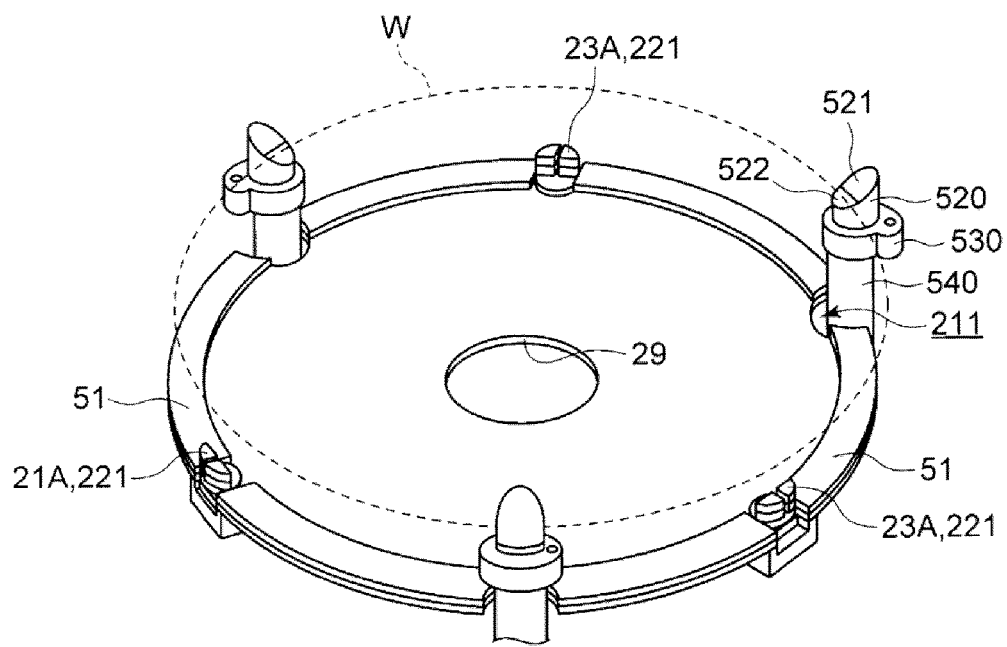
FIG. 10A is a perspective view illustrating a rotating plate and a gripping unit of a liquid processing apparatus according to a third embodiment of the present disclosure.
Figure 10B:
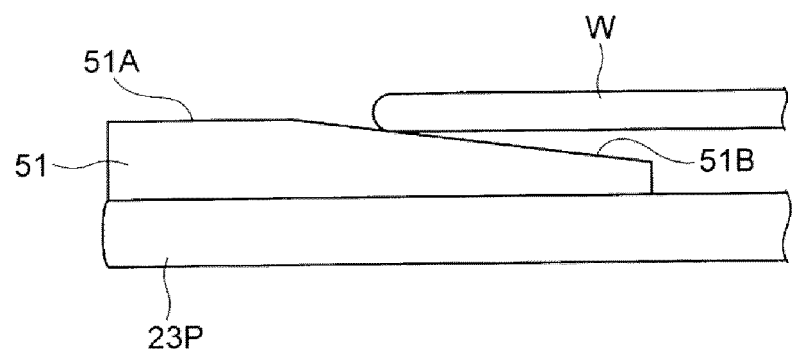
FIG. 10B is a diagram illustrating a wafer supported on a wafer support unit.

The wafer support unit 51 in the third embodiment has a configuration in which the guide pin 52 is removed from the wafer support unit 51 in the first embodiment, as illustrated in FIG. 10B.

The gripping units 23A are disposed at, for example, three sites in the lower peripheral edge of the rotating plate 23P with a gap therebetween. The gripping unit 23A has a structure in which a holding pin 221 holding the wafer W and an operation piece 223 moving the holding pin 221 between a holding position and a release position of the wafer W are connected through a rotating shaft 222.

A contact surface contacting a side circumferential surface of the wafer W is formed on the upper end portion of the holding pin 221, and the holding pin 221 is disposed toward the inside in the diameter direction of the rotating plate 23P. A base end portion of the holding pin 221 is attached to the rotating plate 23P through the rotating shaft 222 and the operation piece 223 extends from the rotating shaft 222 toward the inside in the radial direction of the rotating plate 23P to be slanted downwardly.

The rotating shaft 222 is urged to a direction in which the upper end portion of the holding pin 221 moves toward the inside of the diameter direction of the rotating plate 23P and the wafer W is disposed between holding pins 221 to be held horizontally while allowing a gap between the top surface of the rotating plate 23P and the wafer W, by the urging force of the rotating shaft 222. A circular ring shaped pushing-up plate 251 connected to the elevating mechanism is provided at a lower position of each operation piece 223. When the pushing-up plate 251 is raised to lift up the operation piece 223, the holding pin 221 is rotated around the rotating shaft 222 and moves toward outside of the diameter direction of the rotating plate 23P such that the wafer W being held is released (FIG. 11).

Further, as illustrated in FIG. 10A, below the peripheral edge of the rotating plate 23P, for example, three elevating members 540 formed with rod shaped members and extending in the vertical direction are disposed along the circumferential direction of the rotating plate 23P with a gap therebetween. At the upper end portion of each elevating member 540, the support member 520 which transfers the wafer W between an external conveyance arm and the gripping unit 23A is provided through the holding unit 530.

Each support member 520 is disposed to extend from the upper part of the elevating member 540 upwardly and slanted faces 52I and 522 of which heights becomes gradually smaller toward the inside of the radial direction of the rotating plate 23P from the outside thereof are formed on the top surface of the support member 520. These slanted faces 52I and 522 are configured by a guide face 52I and a support face 522, that have different inclination angles, respectively.

The guide face 52I having a larger inclination angle than the support face 522 is positioned at an outer side in the diameter direction when viewed from the rotating plate 23P and serves to guide the wafer W toward the inside of a region surrounded by three support members 520. Further, the support face 522 disposed inside of the guide face 52I and having a smaller inclination angle than the guide face 521 serves to guide the movement of the wafer W on the support member 520 such that the wafer W disposed on the support members 520 is substantially horizontally supported by its weight (see FIG. 11). As described above, since the guide face 521 and the support face 522 have functions of guiding the wafer W, the guide pin 52 illustrated in, for example, FIG. 4 and FIG. 5 may be omitted in the third embodiment. Accordingly, in the wafer holding and rotating unit 23 of the third embodiment, the number of members colliding with the processing liquid during execution of the liquid processing may be reduced and the influence by, for example, liquid splashing to the wafer W may be suppressed.

The lower parts of respective elevating members 540 are connected to a common connecting plate formed in, for example, a circular ring shape and the common connecting plate may be moved vertically by the elevating mechanism to elevate respective support members 520 simultaneously by an equal distance.

As illustrated in FIGS. 10A and 10B, and FIG. 11, cutout parts 211 are provided in the peripheral edge part of the rotating plate 23P to be corresponded to disposition positions of the elevating members 540, and the rotating plate 23P rotating around a vertical axis is stopped at a position where each cutout part 211 is disposed above the elevating member 540. Each elevating member 540 may pass through the cutout part 211 to cause the support member 520 to protrude from below the rotating plate 23P to above thereof to raise the support member 520 to a transfer position of the wafer W between the external conveyance arm and the support member 520 (see FIG. 11).

In FIGS. 10A and 10B, and FIG. 11, when the external conveyance arm has conveyed a processing target wafer W to the liquid processing apparatus from outside, the external conveyance arm is stopped at the position above the rotating plate 23P. Next, the elevating mechanism operates to raise three elevating members 540 simultaneously. The disposition position of the elevating member 540 is located at a position which does not interfere with the conveyance arm, and when the support face 522 of the support member 520 is raised to be located at a position higher than a height position at which the wafer W is held by the conveyance arm, the wafer W is transferred from the conveyance arm to the support member 520 (FIG. 11). The conveyance arm which has transferred the wafer W to the support member 520 is then retreated from the case 21 (see FIG. 2).

Figure 12:
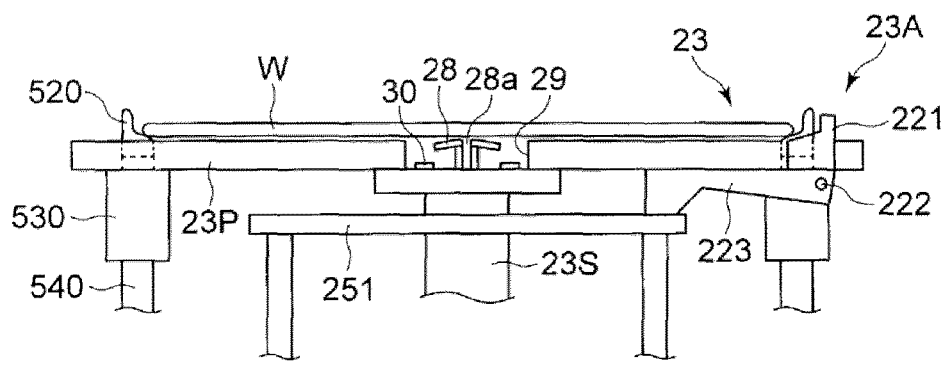
FIG. 12 is another diagram illustrating the operation of the elevatable support member according to the third embodiment.
Figure 13:
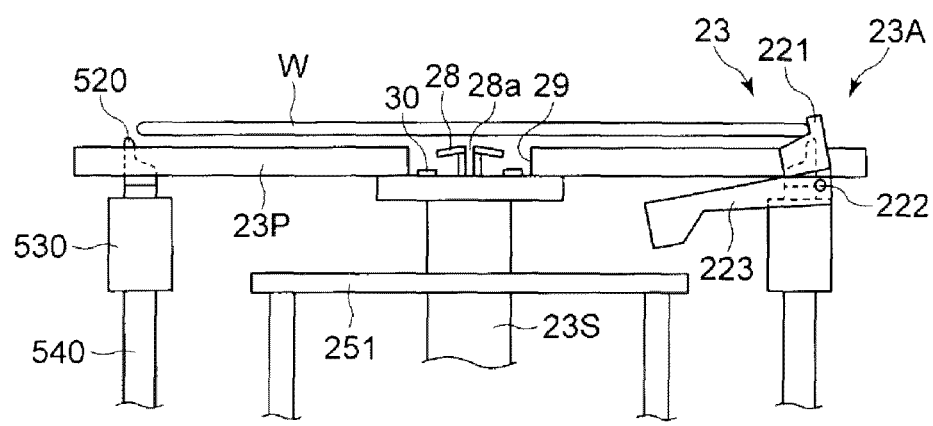
FIG. 13 is yet another diagram illustrating the operation of the elevatable support member according to the third embodiment.

When the wafer W is transferred to the support member 520, the support member 520 is lowered to a position at which the wafer W is transferred to the holding pin 221 of the gripping unit 23A. In this case, the holding pin 221 is in a stand by state while being moved to a release position, and when the support member 520 is lowered to the transfer position, the wafer W is disposed on the wafer support unit 51 (FIG. 12). Next, a pushing-up plate 251 is lowered to move the holding pin 221 from the release position to the hold position of the wafer (FIG. 13). As a result, the wafer W is held by three holding pins 221 to be inserted from the side and is held by the gripping unit 23A with a gap between the top surface of the rotating plate 23P and the wafer W.

As described above, the wafer W conveyed by the conveyance arm may be received by the support member 520 raised by the elevating member 540, and the elevating member 540 may be lowered to easily dispose the wafer W on the support member 520 on the wafer support unit 51 of the rotating plate 23P, and, as a result, the wafer W may be surely held by the gripping unit 23A.

Other Embodiment

In the first, second, and third embodiments, even though examples are described in which the position of the laser light projecting/receiving part is located relatively above the surface of the wafer W and the position of the retro-reflective sheet is located relatively below the surface of the wafer W, the present disclosure is not limited thereto and may be similarly applied to a case where the laser light projecting/receiving part is disposed below the surface of the wafer W and the retro-reflective sheet is located above the surface of the wafer W. Further, in the first, the second, and the third embodiments, examples are described in which the present disclosure is applied to the liquid processing apparatus included in the substrate processing apparatus. However, the present disclosure is not limited thereto and may also be applied to a substrate processing apparatus which performs other processing, for example, heat treatment. Further, in the embodiments, the laser light projecting/receiving part is integrally formed with the laser light projecting part and the laser light receiving part, but the present disclosure is not limited thereto and the laser light projecting/receiving part may be formed with the laser light projecting part and the laser light receiving part separated from each other.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
   a substrate holding unit provided in a substrate processing unit with a rotating plate and a substrate support unit configured to support a substrate above the rotating plate;
   a ring-shaped retro-reflective sheet having a central opening provided on an extended line of a central axis of the substrate holding unit such that the ring-shaped retro-reflective sheet is disposed below the substrate when the substrate is disposed on the substrate holding unit and rotated together with the substrate holding unit;
   a light projecting and receiving part provided above the substrate when the substrate is supported by the substrate support unit and configured to project incident light having a predetermined incident angle to the ring-shaped retro-reflective sheet from a slanted upper side and receive reflected light reflected in the same direction as the incident angle;
   a substrate detection unit separately provided from the light projecting and receiving part and configured to detect a presence or an absence of the substrate on the substrate holding unit based on a signal from the light projecting and receiving part, which indicates an intensity of the reflected light received by the light projecting and receiving part; and
   a supply pipe configured to supply liquid or gas by penetrating through the rotating plate of the substrate holding unit, the supply pipe being provided to penetrate through the central opening of the ring-shaped retro-reflective sheet.

2. The substrate processing apparatus of claim 1, wherein a central par of the ring-shaped retro-reflective sheet is provided on the extended line of the central axis of rotation of the substrate holding and rotating unit.

3. The substrate processing apparatus of claim 1, wherein the retro-reflective sheet is provided on an upper end portion of the supply pipe in a stationary state together with the supply pipe.

4. The substrate processing apparatus of claim 3, wherein an umbrella-shaped part is provided on the upper end portion of the supply pipe and the retro-reflective sheet is attached to the umbrella-shaped part.

5. The substrate processing apparatus of claim 1, wherein the substrate is formed with a semiconductor wafer and the substrate detection unit is configured to detect the presence or the absence of the semiconductor wafer by comparing an intensity of reflected light from the light projecting and receiving part and a predetermined light intensity.

6. The substrate processing apparatus of claim 1, wherein the substrate is formed with a glass substrate and the substrate detection unit is configured to detect the presence or the absence of the glass substrate based on the intensity of the light reflected from the light projecting and receiving part and an attenuation factor of the glass substrate.

7. A substrate detection method of a substrate processing apparatus, where the substrate processing apparatus includes:
   a substrate holding unit provided in a substrate processing unit with a rotating plate and a substrate support unit configured to support a substrate above the rotating plate;
   a ring-shaped retro-reflective sheet having a central opening provided on an extended line of a central axis of the substrate holding unit such that the ring-shaped retro-reflective sheet is disposed below the substrate when the substrate is disposed on the substrate holding unit and rotated together with the substrate holding unit;
   a light projecting and receiving part provided above the substrate when the substrate is supported by the substrate support unit and configured to project incident light having a predetermined incident angle to the ring-shaped retro-reflective sheet from a slanted upper side and receive reflected light reflected in the same direction as the incident angle;
   a substrate detection unit separately provided from the light projecting and receiving part and configured to detect a presence or an absence of the substrate on the substrate holding unit based on a signal from the light projecting and receiving part, which indicates an intensity of the reflected light received by the light projecting and receiving part; and
   a supply pipe configured to supply liquid or gas by penetrating through the rotating plate of the substrate holding unit, the supply pipe being provided to penetrate through the central opening of the ring-shaped retro-reflective sheet,
   the substrate detection method comprising:
   providing the ring-shaped retro-reflective sheet on the substrate holding and rotating unit rotating together with the substrate holding and rotating unit;
   projecting the incident light from the slanted upper side to the retro-reflective sheet by the light projecting and receiving part;
   receiving the reflected light reflected in the same direction as the incident angle from the ring-shaped retro-reflective sheet by the light projecting and receiving part;
   detecting the presence or the absence of the substrate on the substrate holding unit by the substrate detection unit based on the signal from the light projecting and receiving part; and
   supplying the liquid or the gas by penetrating through the rotating plate of the substrate holding unit.

8. The substrate detection method of claim 7, further comprising providing the retro-reflective sheet on an upper end portion of the supply pipe in a stationary state together with the supply pipe.

9. The substrate detection method of claim 7, wherein the substrate is formed with a semiconductor wafer, and the substrate detection method further comprising detecting, by the substrate detection unit, the presence or the absence of the semiconductor wafer by comparing an intensity of reflected light from the light projecting and receiving part and a predetermined light intensity.

10. The substrate detection method of claim 7, wherein the substrate is formed with a glass substrate, and
the substrate detection method further comprising detecting, by the substrate detection unit, the presence or the absence of the glass substrate based on the intensity of the light reflected from the light projecting and receiving part and an attenuation factor of the glass substrate.

11. A computer-readable storage medium storing a computer executable program that, when executed, causes a computer to perform a substrate detection method of a substrate processing apparatus, where the substrate processing apparatus includes:
a substrate holding unit provided in a substrate processing unit with a rotating plate and a substrate support unit configured to support a substrate above the rotating plate;
a ring-shaped retro-reflective sheet having a central opening provided on an extended line of a central axis of the substrate holding unit such that the ring-shaped retro-reflective sheet is disposed below the substrate when the substrate is disposed on the substrate holding unit and rotated together with the substrate holding unit;
a light projecting and receiving part provided above the substrate when the substrate is supported by the substrate support unit and configured to project incident light having a predetermined incident angle to the ring-shaped retro-reflective sheet from a slanted upper side and receive reflected light reflected in the same direction as the incident angle;
a substrate detection unit separately provided from the light projecting and receiving part and configured to detect a presence or an absence of the substrate on the substrate holding unit based on a signal from the light projecting and receiving part, which indicates an intensity of the reflected light received by the light projecting and receiving part; and
a supply pipe configured to supply liquid or gas by penetrating through the rotating plate of the substrate holding unit, the supply pipe being provided to penetrate through the central opening of the ring-shaped retro-reflective sheet,
the substrate detection method comprising:
providing the ring-shaped retro-reflective sheet on the substrate holding and rotating unit rotating together with the substrate holding and rotating unit;
projecting the incident light from the slanted upper side to the retro-reflective sheet by the light projecting and receiving part;
receiving the reflected light reflected in the same direction as the incident angle from the ring-shaped retro-reflective sheet by the light projecting and receiving part;
detecting the presence or the absence of the substrate on the substrate holding unit by the substrate detection unit based on the signal from the light projecting and receiving part; and
supplying the liquid or the gas by penetrating through the rotating plate of the substrate holding unit.

* * * * *